United States Patent [19]

Lechner et al.

[11] Patent Number: 4,468,651
[45] Date of Patent: Aug. 28, 1984

[54] METHOD FOR ELIMINATING THE ZERO POINT ERROR IN AN ITERATIVE ANALOG-DIGITAL CONVERTER

[75] Inventors: Robert Lechner, Otterfing; Frithjof von Sichart, Munich; Peter Picard, Taufkirchen, all of Fed. Rep. of Germany

[73] Assignee: Siemens Aktiengesellschaft, Berlin & Munich, Fed. Rep. of Germany

[21] Appl. No.: 285,625

[22] Filed: Jul. 21, 1981

[30] Foreign Application Priority Data

Aug. 21, 1980 [DE] Fed. Rep. of Germany ....... 3031592

[51] Int. Cl.³ ............................................ H03K 13/08
[52] U.S. Cl. ...................... 340/347 CC; 340/347 AD; 340/347 M
[58] Field of Search ...................... 340/347 M, 347 CC

[56] References Cited

U.S. PATENT DOCUMENTS

| | | | |
|---|---|---|---|
| 3,509,460 | 4/1970 | Mizrahi | 340/347 CC X |
| 3,832,707 | 8/1974 | Buchanan et al. | 340/347 DA |
| 4,017,687 | 4/1977 | Hartzler et al. | 370/112 X |
| 4,056,820 | 11/1977 | Hofer | 340/347 |
| 4,143,361 | 3/1979 | Tammes et al. | 340/347 CC |
| 4,350,975 | 9/1982 | Haque et al. | 340/347 M X |

OTHER PUBLICATIONS

The Engineering Staff of Analog Devices, Inc., Analog-Digital Conversion Handbook, 6/1972, pp. II-46 to II-53.
Schmid, Electronic Analog/Digital Conversions, Van Nostrand Reinhold, 1970, pp. 122-126; 387-392.

*Primary Examiner*—T. J. Sloyan
*Attorney, Agent, or Firm*—Hill, Van Santen, Steadman & Simpson

[57] ABSTRACT

A zero equalization capacitor is connected to a first input of the comparator K, and at the beginning of the equalization phase, a voltage value of zero is placed at both comparator inputs, and a feedback network RN is connected between the comparator output and the capacitor, whereby the capacitor is charged to such a degree that the output signal of the comparator arrives at the decision threshold between the equality or inequality of the comparator inputs.

3 Claims, 5 Drawing Figures

METHOD FOR ELIMINATING THE ZERO POINT ERROR IN AN ITERATIVE ANALOG-DIGITAL CONVERTER

BACKGROUND OF THE INVENTION

1. Field of the Invention

This invention relates to the elimination of zero point errors in converters which use an operational amplifier for the realization of the analog quantity comparator.

2. The Prior Art

In conventional units, even when the voltage difference between the inputs of the comparator is zero, an output voltage is released which deviates from 0 and thus incorrectly indicates the presence of an inequality of the signals supplied to the two inputs. In the vicinity of the zero point of the characteristic of the analog-digital conversion, such an offset error has the result that very small input signals which are caused by crosstalk, and which can be suppressed due to the quantization in the case of such a code conversion, nevertheless are evaluated as useful signal which has exceeded the first quantization level. Therefore, in the case of imperfect zero point equalization, crosstalk is incompletely suppressed.

It is possible to equalize the zero point errors, with the help of potentiometers at the inputs of the comparators, by which a so-called offset voltage is set which is so large that the output signal is precisely 0, and the offset error is thus compensated. This manner of compensation, because of the required equalization operation, is relatively expensive and is not effective against long-time effects which are caused by aging.

Another known measure for the zero equalization of the comparator in the case of analog-digital converters consists in (when no analog signal which is to be converted is present) forcing, with equal probability, positive and negative signs for the digital signal resulting from the "zero" value then present. However, since in the case of speech generated signals, whereby one is concerned with analog quantities to be encoded, the occurrence of negative and positive signs is not uniformly distributed, there results interfering noises. Besides this, the known method mentioned requires a very precise correspondence of the voltage values which lead to the arising of the two signs forced with equal probability, which requires implicated and expensive control apparatus.

SUMMARY OF THE INVENTION

It is a principal object of the present invention to provide a method which guarantees a zero point equalization, which can be realized favorably with regard to cost and which also considers long-time effects and avoids the interferences previously named.

According to the invention, this problem is solved with a method using a zero equalization capacitor, which is connected to a first comparator input, at the beginning of the equalization phase, whereby, when the output signal of the digital-analog converter and the signal value lying at the second comparator input which normally is the analog quantity to be converted are made zero, the capacitor is brought via a feedback network into connection with the output of the comparator, whereby the output signal of the comparator proceeds to the decision threshold between the equality and inequality, of the output signal states which indicate analog values lying at the comparator inputs.

In further embodiments of the invention, different variants of the feedback network to be employed according to the invention are provided, whereby, in one case, the use of amplifier elements of the comparator are presumed which are developed in integrated bipolar technology.

According to a further development of the invention, besides the zero point equalization of the comparator, also a zero point equalization can be undertaken of a current-voltage converter realized also in the form of an operational amplifier via which the output signal of a digital-analog converter is supplied to the comparator (if this is a current comparator), or via which the analog signal which is to be converted is fed to the comparator (if this is a voltage comparator). Zero point errors of such current-voltage converter or voltage-current converter namely have, as a result, a linearity error in the case of the code conversion. Previously, such a zero point equalization was also undertaken with the help of potentiometers which has the disadvantages previously referred to.

By means of still another embodiment of the invention, the relationships are considered which result when certain switches are realized in the form of MOS transistors. These relationships normally lead also to a zero point error if no countermeasures are taken.

BRIEF DESCRIPTION OF THE DRAWINGS

In the following, the inventive method will be explained more precisely with reference to the accompanying drawings, in which.

DESCRIPTION OF THE PREFERRED EMBODIMENTS

Figure 1:
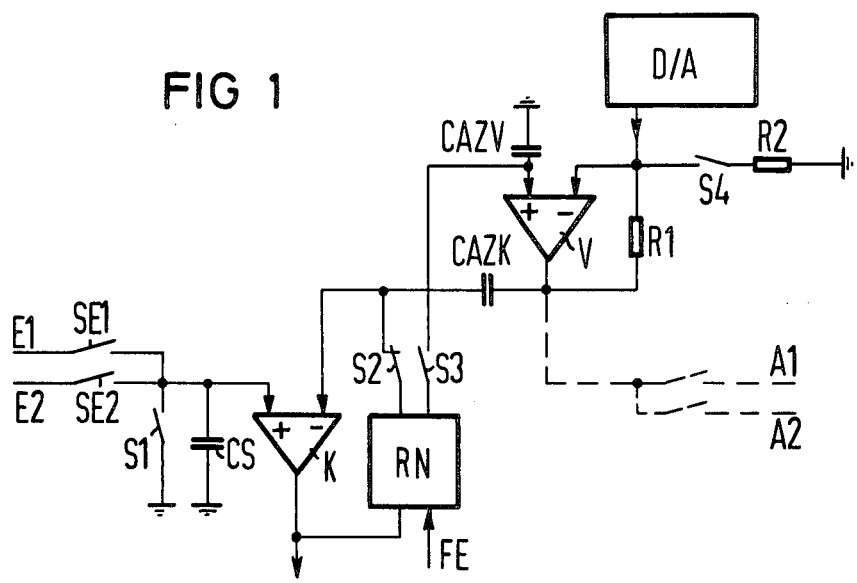
FIG. 1 shows a first illustrative embodiment of the inventive method.

FIG. 1 shows an arrangement for the analog-digital conversion and conversely for the digital-analog conversion (Codec) which is associated with two telephone subscriber stations (not shown), using a two-channel code. The analog signals, delivered by the telephone stations, proceed via filters (not shown) and via sampling switches SE1 and SE2, which are closed during another part of the conversion cycle, to a capacitor CS which can be bridged by a switch S1. One terminal of the capacitor CS is connected with an input of a comparator K to whose other input an analog signal is fed, which signal results from the digital-analog conversion of a digital quantity by the digital-analog converter D/A, which digital quantity resides in a buffer register (not shown). When at the output of the comparator K, a signal occurs indicating an inequality with the quantity in the buffer register, another digital value is set into the buffer register, whereupon the process is repeated. In this manner, an iterative approximation of the digital value takes place to the analog value stored in the holding capacitor CS, as is known per se for example from the German OS No. 2,534,109. In the case of the conversion of digital values determined for the subscriber stations into analog values, only the digital-analog converter D/A is effective, in which case the output signals released by it are directed further via one of the switches A1 and A2 to the pertaining subscriber stations.

The digital-analog converter D/A is realized in the form of a R-2R resistance network which, at its output, delivers summing currents which correspond to the digital values present at its input, and which in the course of an analog-digital conversion are connected to a coupling capacitor CAZK and to the other input of the comparator K.

The output of the comparator K is connectible via a feedback network RN and a switch S2 with the input which is connected with the capacitor CAZK. The feedback network can also be connected via the switch S3 to the input of the current-voltage converter V to which also a capacitor CAZV is connected. The other input of this current-voltage converter, which has a feedback resistor R1, is connected with the D/A converter output, and can be placed at reference potential via the switch S4 and the resistor R2, whose resistance value is small with respect to that of the resistor R1.

In execution of the inventive method, at the beginning of the equalization phase, the output signal of the digital-analog converter D/A is reset to zero (by means not shown) and the voltage lying at the input connected with the holding capacitor CS can be made zero by means of closing of the switch S1. Following this, by means of closing the switch S2, the feedback network RN can be brought into connection with the other input of the comparator K. Via this feedback network, therefore, a charging of the capacitor CAZK takes place so that a charged state arises whereby the output signal of the comparator arrives at the decision threshold between the equality and inequality of the input signal states, which indicate analog values lying at the comparator inputs which here are zero. Thus, it is attained that in the case of the subsequent operation of the analog-digital converter, in the region close to the zero point, only such analog values stored in the holding capacitor CS lead to the generation of a digital value deviating from zero whose amplitude is larger than the first quantization level.

Figures 2, 3:
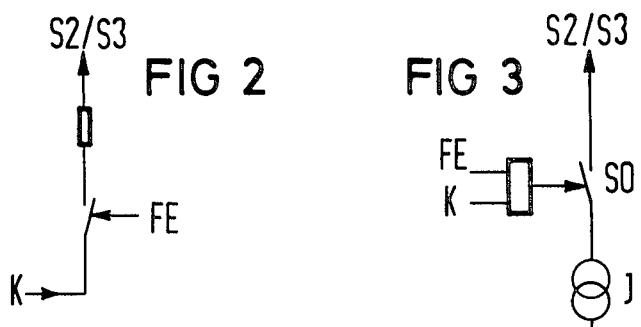
FIGS. 2-4 show examples for the feedback network of FIG. 1.

As FIG. 2 shows, the feedback network RN in the simplest case can be a resistor R of high resistance, via which the capacitor CAZK is charged up until a potential changeover occurs at the output of the comparator K, whereupon the capacitor again discharges until it comes to an opposite potential changeover at the comparator output etc., etc.

Frequently the case occurs that the comparator is realized in bipolar semiconductor technology which signifies that the input side amplifier element continuously requires fan-in input current, which leads to a continuous discharging of the capacitor CAZK. In this case, the feedback network RN is designed corresponding to FIG. 3, which contains a constant current source I, so the switch SO, via which this constant current source is connected, is closed in the zero equalization phase only when the discharge of the capacitor CAZK must be equalized. The current has such an amplitude that during the sampling period (which also determines the conversion period) it surpasses the average value of the discharge current, so that the compensation state outlasts this period.

According to a further design of the invention, besides the zero point equalization of the comparator K, also a zero point equalization of the current-voltage converter (or voltage-current converter which may be present) is undertaken. In FIG. 1 a current-voltage converter V is employed, which converts the summed current released from the digital-analog converter into a voltage value. The zero point equalization of the current-voltage converter V directly follows in time that of the comparator K. After the switch S2 has been opened, the switches S3 and S4 are closed. By means of the closing of the switch S4, the input of the current-voltage converter V, which is connected with the output of the digital-analog converter D/A, is placed via the resistor R2 at ground, with the result that the offset voltage lying at this input is amplified in the ratio R1/R2. The output signal of the current-voltage converter V then proceeds via capacitor CAZK to the one input of the comparator K which was already equalized in the manner described. The output signal of the comparator proceeds, via the feedback network and the switch S3, to the capacitor CAZV and brings about a charging of the same in the manner described in connection with the capacitor CAZK. Since, by means of the closing of the switch S4, the offset error of the converter V(before the equalization) is amplified, a zero point error which perhaps was not yet completely equalized at the comparator no longer has any influence on the total equalization result.

Figure 5:
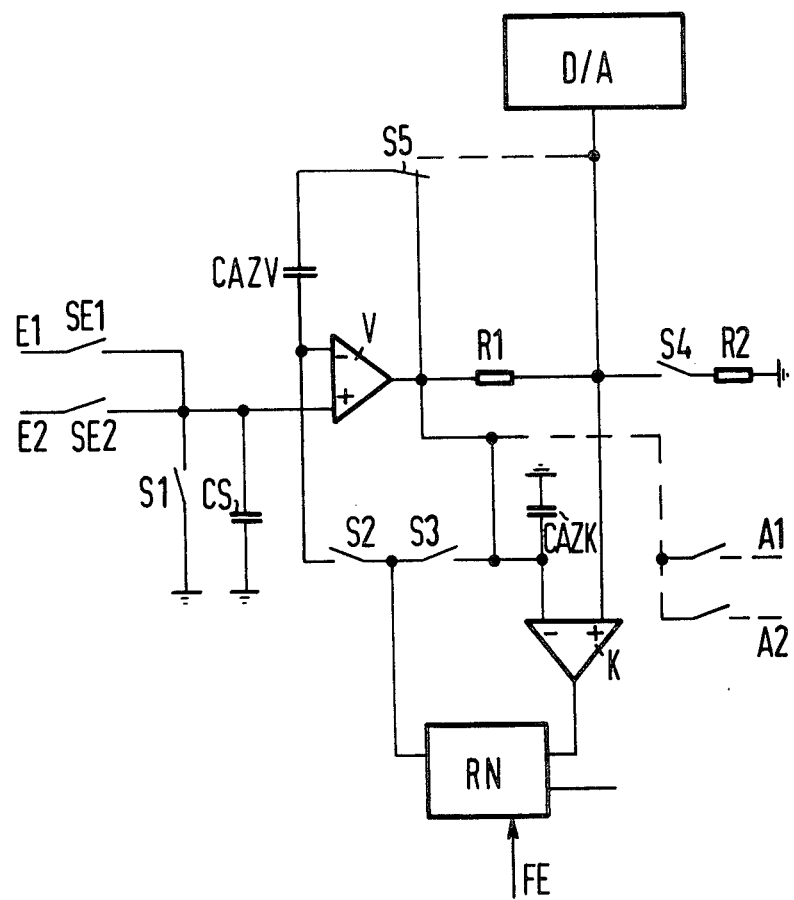
FIG. 5 shows a second variant of the inventive method.

In the case of the circuitry arrangement according to FIG. 5, the comparator K is a current comparator. Thus, supplied to its one input is the total summed current delivered from the digital-analog converter D/A, and to its other input, the analog quantity to be converted is supplied in the form of a current value which is generated by a voltage-current converter V from the voltage on the holding capacitor CS. Connected to the last-named input of the comparator K is a zero equalization capacitor CAZK; the other input of the voltage-current converter V (which is not connected with the holding capacitor)is connected to a zero equalization capacitor CAZV.

During the equalization, processes take place corresponding to those described according to FIG. 1. Thus, by means of closing of the switch S1 which bridges the holding capacitor CS, and by means of a corresponding switching measure within the device D/A, the initial input values for the comparator K are made zero, and by means of closing of the switch S3, the feedback network RN (which can be designed corresponding to the FIGS. 2 through 4) is placed in the feedback loop between the output of the comparator K and that input at which the zero equalization capacitor CAZK lies and this capacitor is charged in the manner described. After opening of the switch S3, and closing the switch S2, the feedback network is placed between the output of the comparator K and that input of the voltage-current converter V to which the other zero equalization capacitor CAZV is connected, and then the switch S4 is closed. The processes which take place in the charging of the last-named zero equalization capacitor are the same as were explained above in connection with FIG. 1. The parts of FIG. 5 which are depicted with broken lines are only effective in the case of a digital/analog conversion, in which case no equalization measures are necessary.

Figure 4:
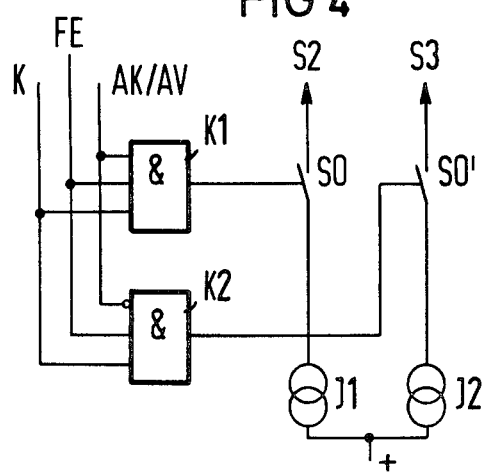

When the circumstances are present which require the use of a feedback network according to FIG. 3, alternately also a feedback network according to FIG. 4 can be employed, which has two current sources I1 and I2. Because of drive signals provided by means of the coincidence members K1 and K2 (via the switches SO and SO') the current sources I1 and I2 are alternately connected to be effective, depending upon whether the comparator K or the converter V is to be equalized (signal AK or AV). This design of the feedback network has advantages with respect to a realization in integrated circuitry engineering.

In practice, the switches SE1, SE2 and S1 of the arrangements according to the FIGS. 1 and 5 are frequently realized as MOS transistors. Due to the parasitic gate-drain capacitance, in the case of negative voltage jumps at the holding capacitor CS, a voltage displacement occurs which acts just like an offset error of the comparator. According to a further feature of the invention, this error is thus compensated in the same manner as an offset error. The switch S1, which bridges the holding capacitor CS, is closed directly before the beginning of the zero equalization phase, and then, before the actual equalization begins, is again opened. The error caused by the parasitic capacitance is compensated in the same manner as the actual offset error of the comparator in the manner described above, whereby the errors caused by opening of the switches SE1 and SE2 are taken into consideration during the following analog-digital conversion process.

What is claimed is:

1. A method for the zero point equalization of an operational amplifier used an an analog quantity comparator in an analog-digital converter, such comparator having first and second inputs connected respectively to the output of the digital-analog coverter and to an analog signal to be converted, said digital-analog coverter operating according to the iterative principle, comprising the steps of:

connecting a zero equalization capacitor in circuit with said first input at the beginning of an equalization phase, setting the output singal of the digital-analog converter and said second input equal to a reference potential, and connecting a feedback network between the output of the comparator and its said first input, whereby said capacitor is charged and the output signal of the comparator arrives at the decision threshold between the equality and inequality of the analog values at the comparator inputs, and wherein the amplifier elements of said comparator are designed as a bipolar integrated circuit and including the steps of employing a feedback network having a constant current source which delivers a current for compensating the discharging of said zero equalization capacitor by the input current delivered to the comparator, and connecting said constant current source during the equalization phase to attain the decision threshold of the comparator, and said constant current source delivering slightly more current than the input current to the comparator during the operating phase which follows said equalization phase.

2. A method for the zero point equalization of an operational amplifier used as a analog quantity comparator in an analog-digital converter, such comparator having first and second inputs connected respectively to the output of the digital-analog coverter and to an analog signal to be coverted, said digital-analog converter operating according to the iterative principle, comprising the steps of:

connecting a zero equalization capacitor in circuit with said first input at the beginning of an equalization phase, setting the output signal of the digital-analog converter and said second input equal to a reference portential, and connecting a feedback network between the output of the comparator and its said first input, whereby said capacitor is charged and the output signal of the comparator arrives at the decision threshold between the equality and inequality of the analog values at the comparator inputs, including the step of employing a second operational amplifier as a current-voltage converter for the connecting of the output signal of the digital-analog converter to said comparator, and disconnecting said feedback network following the zero point equalization of the comparator and, during a second equalization phase, connecting said feedback network to a second zero equalization capacitor and to a second input of the current-voltage converter which is not connected with the output of the digital-analog converter, whereby the second capacitor is charged to a zero equalization level.

3. The method according to claim 2, including the step of connecting the first input of the current-voltage converter to a reference potential during said second equalization phase via a resistor which is small relative to the feedback resistor which connects this input with the output of said current-voltage converter output.

* * * * *